United States Patent [19]
Kano

[11] Patent Number: 5,166,555
[45] Date of Patent: Nov. 24, 1992

[54] DRIVE CIRCUIT COMPRISING A SUBSIDIARY DRIVE CIRCUIT

[75] Inventor: Toshiyuki Kano, Tokyo, Japan
[73] Assignee: NEC Corporation, Tokyo, Japan
[21] Appl. No.: 706,992
[22] Filed: May 29, 1991
[30] Foreign Application Priority Data
  May 31, 1990 [JP] Japan .................. 2-139855
[51] Int. Cl.$^5$ ........................ H03K 19/094
[52] U.S. Cl. .................. 307/451; 307/445; 307/448; 307/443
[58] Field of Search ........... 347/451, 445, 448, 443, 347/473

[56] References Cited

U.S. PATENT DOCUMENTS

| | | | |
|---|---|---|---|
| 4,948,990 | 8/1990 | Shin et al. | 307/448 |
| 4,987,324 | 1/1991 | Wong et al. | 307/451 |
| 5,003,205 | 3/1991 | Kohda et al. | 307/448 |
| 5,023,472 | 6/1991 | Hashimoto et al. | 307/451 |
| 5,030,860 | 7/1991 | Tran | 307/451 |
| 5,079,439 | 1/1992 | Wanlass | 307/443 |

FOREIGN PATENT DOCUMENTS 0001327 1/1989 Japan .................. 307/445

*Primary Examiner*—John S. Heyman
*Assistant Examiner*—Scott A. Ouellette
*Attorney, Agent, or Firm*—Laff, Whitesel, Conte & Saret

[57] ABSTRACT

In a driving circuit supplied with an input signal having one of logic one and zero levels and producing an output signal through an output terminal to drive a load circuit connected to the output terminal, a first MOS transistor (26) is put into a first source-drain conductive state to produce a predetermined positive voltage (VDD) as the output signal when the input signal has the logic one level. The first MOS transistor has a first channel between its source and drain terminals. A second MOS transistor (27) is put into a second source-drain conductive state to produce a ground potential as the output signal when the input signal has the logic zero level. The second MOS transistor has a second channel between its source and drain terminals. Each of the first and the second channels has a restricted channel width to restrict source-drain currents flowing through the first and the second channels. A subsidiary drive circuit (30) drives the load circuit during transition time interval each time when the input signal changes from one of the logic one and zero levels to another of the logic one and zero levels.

2 Claims, 1 Drawing Sheet

DRIVE CIRCUIT COMPRISING A SUBSIDIARY DRIVE CIRCUIT

BACKGROUND OF THE INVENTION

This invention relates to a drive circuit implemented by an MOS (metal-oxide-semiconductor) integrated circuit for driving a load circuit, such as an LSI (large scale integrated circuit).

Such a drive circuit is connected between a gate circuit, such as an AND gate circuit, and the load circuit. The gate circuit produces a gate output signal having one of gate circuit logic one and zero levels. The gate output signal has an insufficient current value to drive the load circuit with a required driving current. The drive circuit serves as a converting circuit for converting the gate output signal into a voltage signal so that the load circuit is driven by the required driving current. Furthermore, the drive circuit serves as a buffer circuit for preventing an adverse influence to which the load circuit would otherwise subject the gate circuit in operation thereof.

The drive circuit comprises an input terminal connected to the gate circuit and an output terminal. The load circuit is connected to the output terminal. The drive circuit is supplied with the gate output signal through the input terminal as an input signal having one of input signal logic one and zero levels.

As will later be described more in detail, the drive circuit further comprises an inverter connected to the input terminal and a p-channel and an n-channel MOS transistor. The inverter inverts the input signal and produces an inverted signal having inverted signal logic zero and logic one levels when the input signal has the input signal logic one and the logic zero levels, respectively. The p-channel MOS transistor has a first gate terminal connected to the inverter, a first source terminal connected to a power supply having a predetermined positive voltage through a power supply line, and a first drain terminal connected to the output terminal. The n-channel type MOS transistor has a second gate terminal connected to the inverter, a second source terminal which is grounded through a ground line, and a second drain terminal connected to the output terminal.

The power supply is connected to a different power supply line connected to a different gate circuit. The second source terminal has a ground potential.

The p-channel MOS transistor is put into a first source-drain conductive state when the inverted signal has the inverted signal logic zero level. The n-channel MOS transistor is put into a second source-drain conductive state when the inverted signal has the inverted signal logic one level. As a result, the predetermined positive voltage is supplied to the load circuit through the output terminal when the input signal has the input signal logic one level. On the contrary, the ground potential is supplied to the load circuit when the input signal has the input signal logic zero level.

In such a drive circuit, a transition state occurs when the input signal changes from one of the input signal logic one and zero levels to another of the input signal one and zero levels. In the transition state, both of the p-channel and the n-channel MOS transistors are simultaneously and instantaneously put into the first and the second source-drain conductive state, respectively. In this moment, a current flows with a large current value from the power supply line to the ground line through the p-channel and the n-channel MOS transistors. This means that the drive circuit has an increased power consumption. Furthermore, the large current generates noise in the different power supply line. The noise causes miss-operation in the different gate circuit.

SUMMARY OF THE INVENTION

It is therefore an object of this invention to provide a drive circuit which is capable of restricting a current flowing through a p-channel and an n-channel MOS transistor.

Other objects of this invention will become clear as the description proceeds.

On describing the gist of this invention, it is possible to understand that a driving circuit has an input terminal supplied with an input signal having one of logic one and zero levels and an output terminal and is for driving a load circuit connected to the output terminal by one of a predetermined positive voltage and a ground potential.

According to this invention, the drive circuit comprises: a first inverter connected to the input terminal for inverting the input signal to produce a first inverted signal having logic zero and logic one levels when the input signal has the logic one and the logic zero levels, respectively; a first MOS transistor having a first gate terminal connected to the first inverter, a first source terminal supplied with the predetermined positive voltage, and a first drain terminal connected to the output terminal and having a first channel between the first source and the first drain terminals. The first MOS transistor is put into a first source-drain conductive state to supply the predetermined positive voltage to the output terminal and to make a first source-drain current flow through the first channel when the inverted signal has one of the logic zero and the logic one levels. The first channel has a first predetermined width to restrict the first source-drain current within a predetermined value. The drive circuit further comprises: a second MOS transistor having a second gate terminal connected to the first inverter, a second source terminal which is grounded, and a second drain terminal connected to the output terminal and having a second channel between the second source and the second drain terminals. The second MOS transistor is put into a second source-drain conductive state to supply the ground potential to the output terminal when the inverted signal has other one of the logic zero and the logic one levels. The second channel has the predetermined width. The drive circuit still further comprises a subsidiary drive circuit supplied with the input signal and the predetermined positive voltage and connected to the output terminal for driving the load circuit by one of the predetermined positive voltage and the ground potential for a predetermined time duration each time when the input signal changes from one of the logic one and zero levels to another one of the logic one and zero levels.

DESCRIPTION OF THE PREFERRED EMBODIMENT

Figure 1:
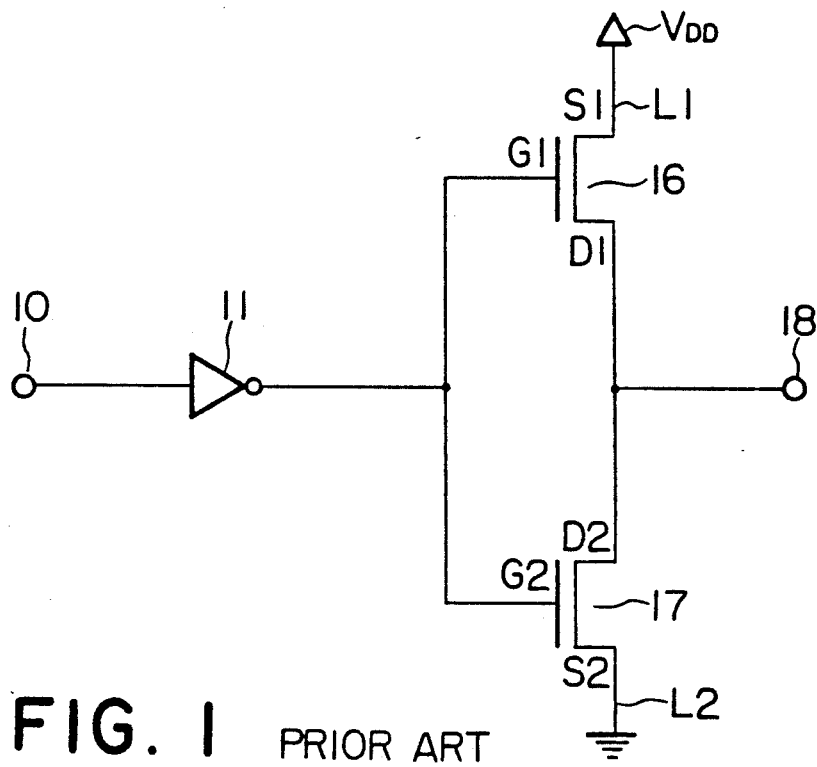
FIG. 1 shows a circuit arrangement of a conventional drive circuit.

Referring to FIG. 1, a conventional drive circuit will be described at first in order to facilitate an understanding of the present invention. The drive circuit is connected between a gate circuit, such as an AND gate circuit, and a load circuit, such as an LSI circuit. The gate and the load circuits are not shown. The gate circuit produces a gate output signal having one of gate signal logic one and zero levels.

The drive circuit is supplied with the gate output signal through an input terminal 10 as a circuit input signal having input signal logic one and zero levels. The drive circuit comprises an inverter 11 and p-channel and n-channel MOS transistors 16 and 17. The p-channel and the n-channel MOS transistors 16 and 17 will be referred to hereinunder as first and second transistors, respectively. The inverter 11 inverts the circuit input signal and produce an inverted signal having inverted signal logic zero and logic one levels when the input signal has the input signal logic one and zero levels. The first transistor 16 is normally on. In other words, the first transistor 16 is put into an on-state when the inverted signal has the inverted logic zero level. The first transistor 16 has a first gate terminal G1 connected to the inverter 11, a first source terminal S1 supplied with a predetermined positive voltage VDD from a power supply (not shown) through a power supply line L1, and a first drain terminal D1 connected to an output terminal 18. The second transistor 17 is normally off. Namely, the second transistor 17 is put into an off-state when the inverted signal has the inverted logic zero level. The second transistor 17 has a second gate terminal G2 connected to the inverter 11, a second source terminal S2 grounded through a ground line L2, and a second drain terminal D2 connected to the output terminal 18.

The power supply is connected to a different power supply line (not shown) connected to a different circuit which is other than the drive circuit being illustrated and is, for example, a different gate circuit (not shown). The second source terminal S2 has a ground potential.

When the circuit input signal has the input signal logic one level, the inverted signal has the inverted signal logic zero level. In this event, the first transistor 16 is put into a first source-drain conductive state, namely, an on-state. In the meanwhile, the second transistor 17 is put into a nonconductive state, namely, an off-state. As a result, the predetermined positive voltage VDD is supplied to the load circuit through the output terminal 18. In the load circuit, supply of the predetermined positive voltage VDD is equivalent to supply of a logic one level.

When the circuit input signal has the input signal logic zero level, the inverted signal has the inverted signal logic one level. In this event, the first transistor 16 is put into the off-state. The second transistor 17 is put into a second source-drain conductive state, namely, the on-state. As a result, the ground potential is supplied to the load circuit. The ground potential is regarded as a signal having a logic zero level.

In such a drive circuit, a transition state occurs when the input signal changes from one of the input signal logic one and zero levels to another of the input signal one and zero levels. In the transition state, both of the first and the second transistors 16 and 17 are simultaneously and instantaneously put into the first and the second source-drain conductive states, respectively. In this state, a current flows with a large current value from the power supply line L1 to the ground line L2 through the first and the second transistors 16 and 17. The large current generates noise in the different power supply line. The noise causes miss-operation in the different gate circuit.

Figure 2:
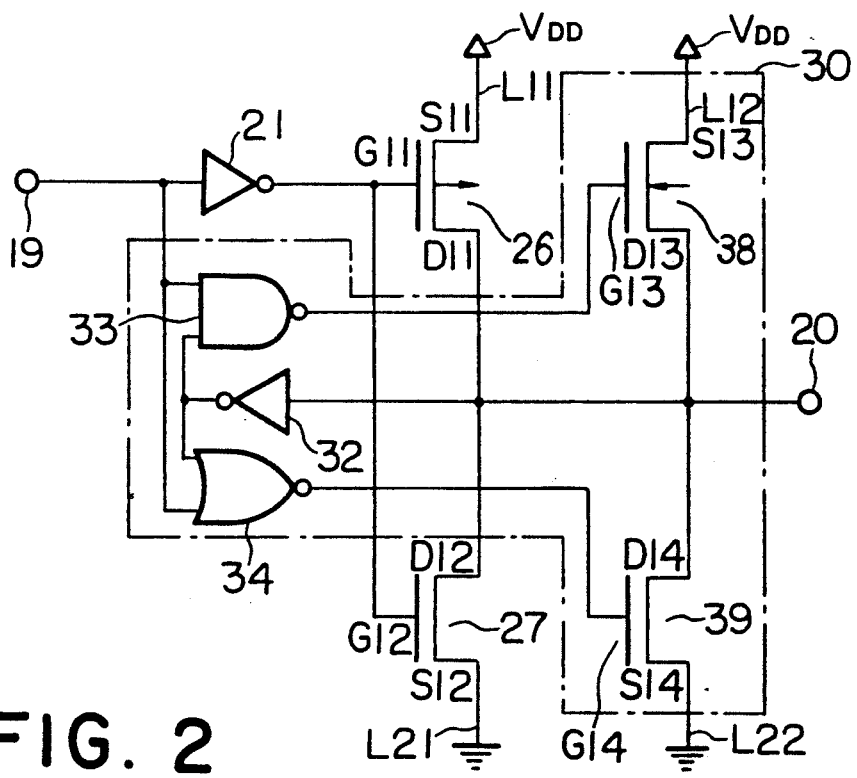
FIG. 2 shows a circuit arrangement of a drive circuit according to a preferred embodiment of this invention.

Referring to FIG. 2, the description will proceed to a drive circuit according to a preferred embodiment of this invention.

As described in conjunction with FIG. 1, the drive circuit is connected between a gate circuit, such as an AND gate circuit, and a load circuit, such as an LSI circuit. The gate and the load circuits are not shown. The drive circuit is supplied with a circuit input signal from the gate circuit through an input terminal 19. The circuit input signal has one of input signal logic one and zero levels. The drive circuit produces a circuit output signal through an output terminal 20 to drive the load circuit. As will later be described, the output signal has one of a predetermined positive voltage depicted at VDD and a ground potential.

The drive circuit comprises a first inverter 21 supplied with the circuit input signal through the input terminal 19. The first inverter 21 inverts the circuit input signal and produces a first inverted signal. The first inverted signal has first inverted signal logic zero and one levels when the circuit input signal has the input signal logic one and zero levels, respectively.

The drive circuit further comprises a p-channel MOS transistor 26, an n-channel MOS transistor 27, and a subsidiary drive circuit 30. The p-channel and the n-channel MOS transistors 26 and 27 are referred to herein as first and second MOS transistors, respectively.

The first MOS transistor 26 has a first gate terminal G11 connected to the first inverter 21, a first source terminal S11 supplied with the predetermined positive voltage VDD from a power supply (not shown) through a first power supply line L11, and a first drain terminal D11 connected to the output terminal 20. The first MOS transistor 26 has a first channel between the first source and the first drain terminals S11 and D11. The first transistor 26 is put into a first source-drain conductive state to supply the predetermined positive voltage VDD to the output terminal 28 as the circuit output signal and to make a first source-drain current flow through the first channel when the first inverted signal has the first inverted signal logic zero level. To restrict the first source-drain current within a predetermined value, the first channel has a predetermined width which is narrower than that of the first transistor 16 described in conjunction with FIG. 1. The predetermined width may be determined in accordance with a stationary source-drain current of the first transistor 26. For example, the predetermined width is approximately equal to 10 microns.

The second transistor 27 has a second gate terminal G12 connected to the first inverter 21, a second source terminal S12 grounded through a first ground line L21, and a second drain terminal D12 connected to the output terminal 20. The second transistor 27 is put into a second source-drain conductive state to supply the ground potential to the output terminal 20 as the circuit output signal when the first inverted signal has the first inverted signal logic one level. The second transistor 27 has a second channel between the second source and the second drain terminals S12 and D12. The second channel has the predetermined width equal to that of the first channel.

The subsidiary drive circuit 30 is for speeding up increment of output voltage of the output signal as will later be described in detail. The subsidiary drive circuit 30 comprises a second inverter 32, a NAND gate circuit 33, and a NOR gate circuit 34. The second inverter 32 is connected to the output terminal 20 and inverts the circuit output signal to produce a second inverted signal.

The second inverter 32 has a predetermined threshold level. When the voltage of the circuit output signal decreases to the predetermined threshold level, the second inverter 32 produces the second inverted signal having the second inverted signal logic one level. When the voltage of the circuit output signal becomes higher than the predetermined threshold level, the second inverter 32 produces the second inverted signal having the second inverted signal logic zero level. As a result, the second inverted signal has the second inverted signal logic zero and one levels, when the circuit output signal has the predetermined positive voltage and the ground potential, respectively.

The NAND gate circuit 33 has a first NAND input terminal supplied with the circuit input signal and a second NAND input terminal supplied with the second inverted signal. The NAND gate circuit 33 produces a NAND output signal having a NAND signal logic zero level only when the circuit input signal and the second inverted signal have the input signal logic one level and the second inverted signal logic one level, respectively. Otherwise, the NAND gate circuit 33 produces the NAND output signal having a NAND signal logic one level.

The NOR gate circuit 34 has a first NOR input terminal supplied with the circuit input signal and a second NOR input terminal supplied with the second inverted signal. The NOR gate circuit 34 produces a NOR output signal having a NOR signal logic one level only when the circuit input signal and the second inverted signal have the input signal logic zero level and the second inverted signal logic zero level, respectively. Otherwise, the NOR gate circuit 34 produces the NOR output signal having a NOR signal logic zero level.

The subsidiary drive circuit 30 further comprises a subsidiary p-channel MOS transistor 38 and a subsidiary n-channel MOS transistor 39. The subsidiary p-channel and the subsidiary n-channel MOS transistors 38 and 39 will be referred to hereinunder as third and fourth MOS transistors, respectively.

The third MOS transistor 38 has a third gate terminal G13 supplied with the NAND output signal, a third source terminal S13 supplied with the predetermined positive voltage VDD from the power supply through a second power supply line L12, and a third drain terminal D13 connected to the output terminal 20. The third MOS transistor 38 has a third channel between the third source and the third drain terminals S13 and D13 to make a third source-drain current flow through the third channel. The power supply is connected to a different power supply line (not shown).

The fourth transistor 39 has a fourth gate terminal G14 supplied with the NOR output signal, a fourth source terminal S14 grounded through a second ground line L22, and a fourth drain terminal D14 connected to the output terminal 20. The fourth transistor 39 has a fourth channel between the fourth source and the fourth drain terminals S14 and D14 to make a fourth source-drain current flow through the fourth channel. Each of the third and the fourth channels has a prescribed width wider than the predetermined width. The prescribed width may be determined in accordance with a capacity of the load circuit. For example, the prescribed width is approximately equal to one millimeter.

The description will be made as regards operation of the drive circuit.

When the circuit input signal has the input signal logic zero level, the first inverted signal has the first inverted signal logic one level. In this event, the first, the third, and the fourth MOS transistors 26, 38, and 39 are put into a nonconductive state, namely, an off state. The second MOS transistor 27 is put into a second source-drain conductive state, namely, an on state. A first source-drain conductive state will shortly be described. As a result, the ground potential is supplied to the output terminal 20 as the circuit output signal. In the load circuit, supply of the ground potential is regarded as supply of a logic zero level.

When the circuit input signal changes from the input signal logic zero level to the input signal logic one level, the second inverted signal has the second inverted signal logic zero level. At this moment of change, the first MOS transistor 26 changes from the off state to the first source-drain conductive state, namely, an on state. The second MOS transistor 27 changes from its on state to its off state. Subsequently, the NAND output signal changes from the NAND signal logic one level to the NAND signal logic zero level because the circuit input signal and the second inverted signal have the input signal logic one level and the second inverted signal logic one level, respectively. As a result, the third MOS transistor 38 changes from its off state to a third source-drain conductive state, namely, an on state. The NOR gate circuit 34 keeps the NOR gate output signal having the NOR signal logic zero level. Accordingly, the fourth MOS transistor 39 keeps its off state.

As a result, the first and the third MOS transistors 26 and 38 become their on states. The second and the fourth MOS transistors 27 and 39 are put into their off states. Accordingly, the predetermined positive voltage VDD is supplied to the load circuit as the circuit output signal through the output terminal 20. In the load circuit, supply of the predetermined positive voltage VDD is equivalent to supply of the logic one level. Particularly, the circuit output signal is supplied to the load circuit with a large current value because the third MOS transistor 38 has the third channel of the prescribed width wider than the first channel of the first MOS transistor 26. This means that the drive circuit according to this invention has an increased driving ability for the load circuit.

In the drive circuit, a transition state occurs when the circuit input signal changes from the input signal logic zero level to the input signal logic one level. In the transition state, the second MOS transistor 27 keeps its on state during a transition time interval after the first and the third MOS transistors 26 and 38 change from their off states to their on states. The transition time interval is approximately equal to one through two nanoseconds. In other words, the first through the third MOS transistors 26, 27, and 38 are put into their on states throughout the transition state. In this state, a current flows from the first and the second power supply lines L11 and L12 to the first ground line L21 through the first through the third MOS transistors 26, 27, and 38. The current is, however, restricted within a predetermined current value because the second MOS transistor 27 has the second channel of the predetermined width smaller than that of the second transistor 17 described with reference to FIG. 1. The predetermined current value is approximately equal to one-fiftieth through one-hundredth of the current which flows the first and the second transistors 16 and 17 (FIG. 1) in the transition state. This means that it is possible to prevent the generation of noise.

When the output voltage becomes equal to the predetermined threshold level soon after supply of the predetermined positive voltage VDD, the second inverted signal changes from the second inverted signal logic one level to the second inverted signal logic zero level. At this moment, the NAND output signal changes from the NAND signal logic zero level to the NAND signal logic one level. As a result, the third MOS transistor 38 is put into its off state. Then, the load circuit is supplied with the predetermined positive voltage VDD through the first MOS transistor 26 only.

When the circuit input signal changes from the input signal logic one level to the input signal logic zero level, the first inverted signal has the first inverted signal logic one level. In this event, the first MOS transistor 26 changes from its on state to its off state. The third MOS transistor 38 keeps its off state. The second MOS transistor 27 changes from its off state to its on state. The NAND gate circuit 33 keeps the NAND output signal having the NAND signal logic one level because the second inverted signal has the second inverted signal logic zero level. On the contrary, the NOR output signal changes from the NOR signal logic zero level to the NOR signal logic one level because the circuit input signal and the second inverted signal have the input signal logic zero level and the second inverted signal logic zero level, respectively. As a result, the fourth MOS transistor 39 changes from its off state to a fourth source-drain conductive state, namely, an on-state.

Thus, the first and the second MOS transistors 26 and 38 become their off states. The second and the fourth MOS transistors 27 and 39 are put into their on states. Accordingly, the ground potential is supplied to the load circuit through the output terminal 20 as the output signal.

As mentioned before, the transition state occurs when the circuit input signal changes from the input signal logic one level to the input signal logic zero level. In the transition state, the first MOS transistor 26 keeps its on state during the transition time duration after the second and the fourth MOS transistors 27 and 39 change from their off-states to their on states. In this state, a current flows from the first power supply line L11 to the first and the second ground lines L21 and L22 through the first and the second MOS transistors 26 and 27 and the fourth MOS transistor 39. The current is, however, restricted within the predetermined current value because the first and the second MOS transistors 26 and 27 have the first and the second channels of the predetermined width smaller than that of the second transistor 17 described with reference to FIG. 1.

When the output voltage decreases to the predetermined threshold level by the off state of the first MOS transistor 26, the second inverted signal changes from the second inverted signal logic zero level to the second inverted signal logic one level. Subsequently, the NOR output signal changes from the NOR signal logic one level to the NOR signal logic zero level. As a result, the fourth MOS transistor 39 is put into its off state. Thereafter, the load circuit is supplied with the ground potential through the second MOS transistor 26 only.

While this invention has thus far been described in conjunction with a single preferred embodiment thereof, it will be readily possible for those skilled in the art to put this invention into practice in various other manners.

What is claimed is:

1. A driving circuit including an input terminal supplied with an input signal having one of logic one and zero levels and an output terminal for driving a load circuit connected to said output terminal in response to an output signal having one of a predetermine positive voltage and a ground potential said driving circuit comprising:

a first inverter connected to said input terminal for inverting said input signal to produce a first inverted signal having logic zero and logic one levels when said input signal has said logic one and said logic zero levels, respectively;

a first MOS transistor having a first gate terminal connected to an output of said first inverter, a first source terminal supplied with said predetermined positive voltage, and a first drain terminal connected to said output terminal and having a first channel between said first source and said first drain terminals, said first MOS transistor being put into a first source-drain conductive state to supply said predetermined positive voltage to said output terminal and to make a first source-drain current flow through said first channel when said inverted signal has one of said logic and said logic one levels, said first channel having a first predetermined width in order to restrict said first source-drain current within a predetermined value;

a second MOS transistor having a second gate terminal connected to an output of said first inverter, a second source terminal which is grounded, and a second drain terminal connected to said output terminal and having a second channel between said second source and said second drain terminals, said second MOS transistor being put into a second source-drain conductive state in order to supply said ground potential to said output terminal when said inverted signal has the other one of said logic zero and said logic one levels, said second channel having said predetermined width;

a subsidiary drive circuit which is grounded and which is supplied with said input signal, said output signal, and said predetermined positive voltage for driving said load circuit by one of said predetermined positive voltage and said ground potential during a transition time interval each time when said input signal changes from one of said logic one and zero levels to another of said logic one and zero levels; and supply means for supplying said output signal to said subsidiary drive circuit.

2. A driving circuit including an input terminal supplied with an input signal having one of logic one and zero levels and an output terminal for driving a load circuit connected to said output terminal in response to an output signal having one of a predetermine positive voltage and a ground potential said driving circuit comprising:

a first inverter connected to said input terminal for inverting said input signal to produce a first inverted signal having logic zero and logic one levels when said input signal has said logic one and said logic zero levels, respectively;

a first MOS transistor having a first gate terminal connected to an output of said first inverter, a first source terminal supplied with said predetermined positive voltage, and a first drain terminal connected to said output terminal and having a first channel between said first source and said first drain terminals, said first MOS transistor being put into a first source-drain conductive state to supply said predetermined positive voltage to said output terminal and to make a first source-drain current flow through said first channel when said inverted signal has one of said logic and said logic one levels, said first channel having a first predetermined width in order to restrict said first source-drain current within a predetermined value;

a second MOS transistor having a second gate terminal connected to an output of said first inverter, a second source terminal which is grounded, and a second drain terminal connected to said output terminal and having a second channel between said second source and said second drain terminals, said second MOS transistor being put into a second source-drain conductive state in order to supply said ground potential to said output terminal when said inverted signal has the other one of said logic zero and said logic one levels, said second channel having said predetermined width;

a subsidiary drive circuit which is grounded and which is supplied with said input signal, said output signal, and said predetermined positive voltage for driving said load circuit by one of said predetermined positive voltage and said ground potential during a transition time interval each time when said input signal changes from one of said logic one and zero levels to another of said logic one and zero levels;

supply means for supplying said output signal to said subsidiary drive circuit;

wherein said subsidiary drive circuit comprises a second inverter supplied with said output signal through said supply means for inverting said output signal to produce a second inverted signal having logic zero and one levels when said output terminal is supplied with said predetermined positive voltage and said ground potential, respectively;

a NAND gate circuit having a first NAND input terminal supplied with said input signal and a second NAND input terminal connected to an output of said second inverter for producing a NAND output signal;

a NOR gate circuit having a first NOR input terminal supplied with said input signal and a second NOR input terminal connected to an output of said second inverter for producing a NOR output signal;

a third MOS transistor having a third gate terminal supplied with said NAND output signal, a third source terminal supplied with said predetermined positive voltage, and a third drain terminal connected to said output terminal and having a third channel between said third source and said third drain terminals; and a fourth MOS transistor having a fourth gate terminal supplied with said NOR output signal, a fourth source terminal which is grounded, and a fourth drain terminal connected to said output terminal and having a fourth channel between said fourth source and said fourth drain terminals, each of said third and said fourth channels having a prescribed width that is wider than said predetermined width.

* * * * *